United States Patent
Guo et al.

(10) Patent No.: US 6,660,635 B1
(45) Date of Patent: Dec. 9, 2003

(54) PRE-LDD WET CLEAN RECIPE TO GAIN CHANNEL LENGTH SCALING MARGIN BEYOND SUB-0.1 $\mu M$

(75) Inventors: Jyh-Chyurn Guo, HsinChu (TW); Wu-Der Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/101,653

(22) Filed: Mar. 20, 2002

(51) Int. Cl.⁷ .................. H01L 21/302; H01L 24/461
(52) U.S. Cl. .................. 438/689; 257/336; 438/906
(58) Field of Search .................. 257/336, 344, 257/408; 438/906, 963, 974, 290, 163, 689; 204/510; 134/1.2, 1.3, 3; 427/532, 534; 131/1

(56) References Cited

U.S. PATENT DOCUMENTS

| | | | |
|---|---|---|---|
| 4,652,334 A | 3/1987 | Jain et al. | 156/628 |
| 5,486,266 A | 1/1996 | Tsai et al. | 156/657.1 |
| 5,811,334 A * | 9/1998 | Buller et al. | 438/264 |
| 5,960,322 A | 9/1999 | Xiang et al. | 438/791 |
| 6,150,277 A | 11/2000 | Torek | 438/705 |
| 6,214,682 B1 | 4/2001 | Wang | 438/301 |
| 6,291,299 B1 * | 9/2001 | Chu | 438/290 |
| 6,368,927 B1 * | 4/2002 | Lee | 438/300 |
| 6,410,429 B1 * | 6/2002 | Ho et al. | 438/655 |
| 6,429,144 B1 * | 8/2002 | Vines et al. | 438/745 |
| 2001/0039116 A1 * | 11/2001 | Takeshima et al. | 438/689 |
| 2002/0045356 A1 * | 4/2002 | Suzuki | 438/749 |
| 2002/0102775 A1 * | 8/2002 | Houng et al. | 438/143 |
| 2002/0102852 A1 * | 8/2002 | Verhaverbeke et al. | 438/690 |
| 2002/0119647 A1 * | 8/2002 | Riley et al. | 438/595 |
| 2002/0123161 A1 * | 9/2002 | Ushiki et al. | 438/14 |
| 2002/0146888 A1 * | 10/2002 | Ryu | 438/300 |
| 2002/0148483 A1 * | 10/2002 | Mertens et al. | 134/1.3 |
| 2002/0155653 A1 * | 10/2002 | Ikegami | 438/202 |

OTHER PUBLICATIONS

Dr. Walsh, Initial Wafer clean, Aug. 6, 1997, http://mitgh-mr.spd.louisville.sops/sop1.html.*

* cited by examiner

Primary Examiner—Long Pham
Assistant Examiner—Thao X. Le
(74) Attorney, Agent, or Firm—George O. Saile; Stephen B. Ackerman; Stephen G. Stanton

(57) ABSTRACT

A method of cleaning a substrate before and after an LDD implantation comprising the following sequential steps. A substrate having a gate structure formed thereover is provided. The substrate is cleaned by a wet clean process including $NH_4OH$. An LDD implantation is performed into the substrate to form LDD implants. The substrate is cleaned by a wet clean process excluding $NH_4OH$.

49 Claims, 1 Drawing Sheet

US 6,660,635 B1

PRE-LDD WET CLEAN RECIPE TO GAIN CHANNEL LENGTH SCALING MARGIN BEYOND SUB-0.1 μM

FIELD OF THE INVENTION

The present invention relates generally to semiconductor fabrication and more specifically to methods of cleaning a semiconductor wafer before and after low-doped drain (LDD) implantation.

BACKGROUND OF THE INVENTION

Complimentary metal-oxide semiconductor (CMOS) technology demands channel length scaling beyond 0.1 μm and brings new challenges to channel/source/drain engineering by conventional implant technology.

Wet clean processes must be free from silicon (Si) recessing, that is wet clean processes should not also consume the silicon the processes are cleaning. This is particularly important for post implantation to reduce the implantation dose loss or the dose variation induced electrical instability.

U.S. Pat. No. 6,150,277 to Torek describes a method of using TMAH to etch an implanted area.

U.S. Pat. No. 6,214,682 B1 to Wang describes a process to reduce transient enhanced diffusion (TED) using an anneal.

U.S. Pat. No. 4,652,334 to Jain et al., U.S. Pat. No. 5,690,322 to Xiang et al., U.S. Pat. No. 5,486,266 to Tsai et al. and U.S. Pat. No. 5,811,334 to Buller et al. describe related methods.

SUMMARY OF THE INVENTION

Accordingly, it is an object of one or more embodiments of the present invention to provide an improved method of LDD implant cleaning.

Other objects will appear hereinafter.

It has now been discovered that the above and other objects of the present invention may be accomplished in the following manner. Specifically, a substrate having a gate structure formed thereover is provided. The substrate is cleaned by a wet clean process including $NH_4OH$. An LDD implantation is performed into the substrate to form LDD implants. The substrate is cleaned by a wet clean process excluding $NH_4OH$.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Discovered by the Inventors

The following problem has been discovered by the inventors and is not to be considered prior art for the purposes of this invention.

The inventors have found in 0.1 μm gate-stack process development practice that using $NH_4OH$ in conventional wet cleaning processes have a significant deleterious effect on core NMOS device's short channel effect (SCE) and gate oxide integrity (GOI). However, removal of $NH_4OH$ from the wet clean process led to significantly worse $V_T$ roll-off and degradation of short channel margin. Further, diminishing reverse short channel effect (RSCE) was noticed as another symptom closely related with worse $V_T$ roll-off and suppression of boron (B) transient enhanced diffusion (TED) is proposed as the possible mechanism. This new finding suggests that boron TED should be critically controlled by the arsenic (As) implant damage and its location.

Initial Structure

Figure 1:
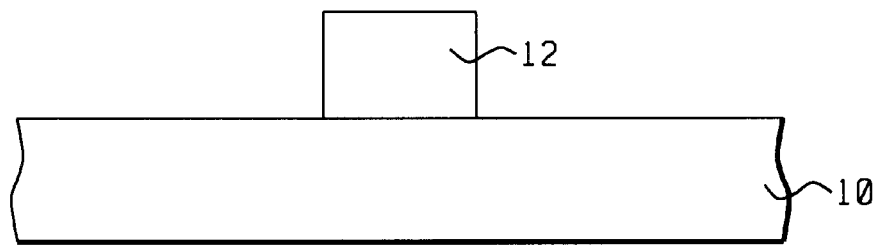
FIGS. 1 to 4 schematically illustrate a preferred embodiment of the present invention.

As shown in FIG. 1, structure 10 includes gate structure 12 formed by a gate etch process. Structure 10 is preferably a silicon substrate and is understood to possibly include a semiconductor wafer or substrate. Gate structure is preferably comprised of polysilicon with an underlying gate oxide layer (not shown).

The present invention discloses a new finding and mechanism useful to, inter alia, gain channel length scaling margin without resort to lower energy implants or more expensive anneal processes. It has been discovered that the inclusion of $NH_4OH$ in a pre-LDD implant 18 clean 14 and the exclusion of $NH_4OH$ in a post-LDD implant 18 clean 22 achieves these desirable qualities as described below.

Pre-LDD Wet Clean 14

Figure 2:
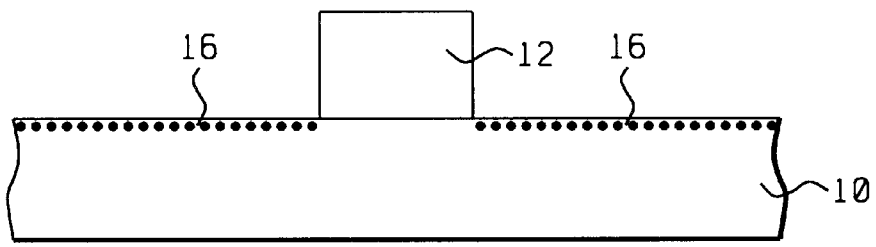

As shown in FIG. 2, a pre-LDD wet clean 14 that includes $NH_4OH$ is then used to clean silicon wafer 10 and to also intentionally create micro-recesses 16 within the LDD or extension area created by consumption of some of the silicon of silicon wafer 10. The chemical etching effect causes $NH_4OH$ to attack the silicon (Si) and form microrecesses 16 The inclusion of $NH_4OH$ in the pre-LDD wet clean 14 enhances reverse short channel effect (RSCE) and gain channel length scaling margin.

Pre-LDD wet clean 14 is conducted at the following conditions:

$NH_4OH$: preferably from about 10 to 30% by volume and more preferably from about 15 to 20% by volume;

$H_2O_2$: preferably from about 10 to 40% by volume and more preferably from about 20 to 30% by volume;

$H_2O$: preferably from about 90 to 100% by volume and more preferably from about 95 to 100% by volume;

temperature: preferably from about 25 to 80° C. and more preferably from about 40 to 75° C.; and time: preferably from about 30 to 500 seconds and more preferably from about 200 to 450 seconds.

LDD Implant 18

Figure 3:
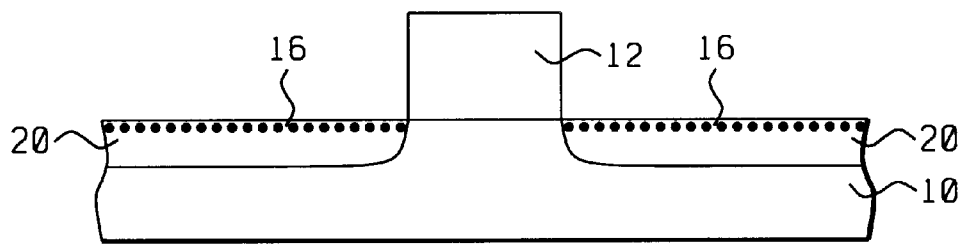

As shown in FIG. 3, an LDD implant 18 is performed on the structure of FIG. 2 to form LDD implants 20 to a depth of preferably from about 200 to 800 Å and more preferably from about 100 to 300 Å. LDD implant 18 is conducted using $As^{75}$, $Sb^{221}$, $BF_2$ or $B^{11}$ atoms at a dose of preferably from about $1\times10^{13}$ to $2\times10^{15}$ atoms/$cm^2$ and more preferably from about $1\times10^{14}$ to $1\times10^{15}$ atoms $cm^2$; and an energy of preferably from about 0.2 to 70 keV and more preferably from about 0.2 to 50 keV.

Shallow junctions formed by the LDD implant 18 are very shallow in the 0.1 μm design rule and sub 0.1 μm design rule for which the method of the present invention is admirably suited.

Optional Fine Tuning of LDD Implant 18 Energy

Optionally, fine tuning the LDD implant 18 energy for ultra-low NLDD implants (to form $N^+$ extensions 20) combined with the NH$_4$OH budget described herein may also be used to further optimize RSCE and gain channel length scaling margin. That is, the LDD implant 18 energy is preferably from about 0.2 to 70 keV and more preferably from about 2 to 25 keV.

The choice of LDD implant energies depends upon the implant species and the junction depth requirements. For example, for core devices with a junction depth requirement of less than about 500 Å, the implant energy should be less than about 5 keV when using As$^{75}$ or BF$_2$ but may be less than about 1 keV, i.e. from about 0.2 to 0.5 keV when using BF$^{11}$. For input/output (I/O) devices with a junction depth requirement of less than about 1000 Å, the implant energy can be increased to from about 20 to 40 keV when using BF$_2$ for P-type metal oxide semiconductor (PMOS).

Post-LDD Wet Clean 22

Figure 4:
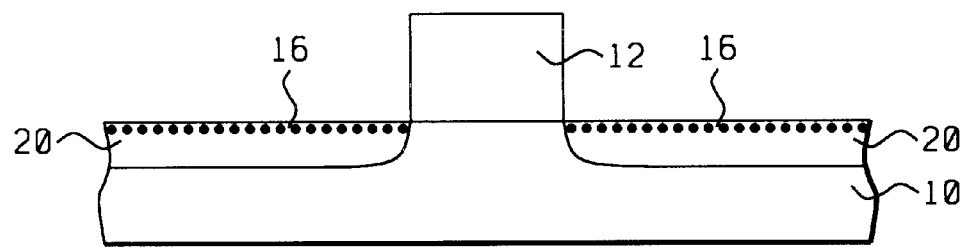

As shown in FIG. 4, the structure of FIG. 3 is subjected to a post-LDD implant wet clean 22 that excludes NH$_4$OH.

By excluding NH$_4$OH in the post-LDD clean 20, the post-LDD clean 20 reduces: (1) the dose lose, that is the dose loss of shallow junctions due to further silicon recess; (2) the dose variation induced device degradation; and (3) electrical instability.

Post-LDD wet clean 20 is conducted at the following conditions:

H$_2$O$_2$: preferably from about 10 to 40% by volume and more preferably from about 20 to 30% by volume;

H$_2$O: preferably from about 90 to 100% by volume and more preferably from about 95 to 100% by volume;

temperature: preferably from about 25 to 80° C. and more preferably from about 40 to 75° C.; and time: preferably from about 30 to 500 seconds and more preferably from about 200 to 450 seconds.

Further processing may then proceed. For example, spacers may be formed on the side walls of gate structure 12, high dose doped (HDD) may then be performed into silicon substrate 10, etc.

Advantages of the Present Invention

The advantages of one or more embodiments of the present invention include:

1. gain channel length scaling margin beyond 0.1 µm;
2. minimization of silicon recess;
3. reduction of source/drain series resistance;
4. acceptable gate oxide integrity (GOI);
5. shallow junction dose loss is reduced;
6. the dose variation induced device degradation is reduced; and
7. the electrical instability is reduced.

While particular embodiments of the present invention have been illustrated and described, it is not intended to limit the invention, except as defined by the following claims.

We claim:

1. A method of cleaning a substrate before and after an LDD implantation, comprising the sequential steps of:

providing a substrate having a gate structure formed thereover;

cleaning the substrate by a wet clean process including NH$_4$OH;

performing an LDD implantation into the substrate to form LDD implants;

not contacting the LDD implanted substrate with NH$_4$OH; and then cleaning the substrate by only a wet clean process excluding NH$_4$OH.

2. The method of claim 1, wherein the substrate is a silicon substrate or a silicon semiconductor wafer and the gate structure is comprised of a gate oxide layer with an overlying polysilicon layer.

3. The method of claim 1, wherein the wet clean process including NH$_4$OH is conducted at the following parameters:

NH$_4$OH: from about 10 to 30% by volume;
H$_2$O$_2$: from about 10 to 40% by volume;
H$_2$O: from about 90 to 100% by volume;
temperature: from about 25 to 80° C.; and
time: from about 30 to 500 seconds.

4. The method of claim 1, wherein the wet clean process including NH$_4$OH is conducted at the following parameters:

NH$_4$OH: from about 15 to 20% by volume;
H$_2$O$_2$: from about 20 to 30% by volume;
H$_2$O: from about 95 to 100% by volume;
temperature: from about 40 to 75° C.; and
time: from about 200 to 450 seconds.

5. The method of claim 1, wherein the wet clean process excluding NH$_4$OH is conducted at the following parameters:

H$_2$O$_2$: from about 10 to 40% by volume;
H$_2$O: from about 90 to 100% by volume;
temperature: from about 25 to 80° C.; and
time: from about 30 to 500 seconds.

6. The method of claim 1, wherein the wet clean process excluding NH$_4$OH is conducted at the following parameters:

H$_2$O$_2$: from about 20 to 30% by volume;
H$_2$O: from about 95 to 100% by volume;
temperature: from about 40 to 75° C.;
time: from about 200 to 450 seconds.

7. The method of claim 1, wherein the wet clean process including NH$_4$OH forms micro-recesses in the substrate.

8. The method of claim 1, wherein the LDD implantation is performed at the following parameters:

dosage: from about $1 \times 10^{13}$ to $2 \times 10^{15}$ atoms/cm$^2$; and
energy: from about 0.2 to 70 keV.

9. The method of claim 1, wherein the LDD implantation is performed at the following parameters:

dosage: from about $1 \times 10^{14}$ to $1 \times 10^{15}$ atoms/cm$^2$; and
energy: from about 0.2 to 50 keV.

10. The method of claim 1, wherein the LDD implantation uses an element selected from the group consisting of As$^{75}$, Sb$^{221}$, BF$_2$ and B$^{11}$.

11. The method of claim 1, wherein the LDD implantation energy is fine tuned to form N-type implants.

12. The method of claim 1, wherein the LDD implants are N-type LDD implants and the LDD implantation energy is from about 0.2 to 70 keV.

13. The method of claim 1, wherein the LDD implants are N-type LDD implants and the LDD implantation energy is from about 0.2 to 50 keV.

14. A method of cleaning a silicon substrate before and after an LDD implantation, comprising the sequential steps of:

providing a silicon substrate having a gate structure formed thereover;

cleaning the silicon substrate by a wet clean process including NH$_4$OH;

performing an LDD implantation into the silicon substrate to form LDD implants;

not contacting the LDD implanted silicon substrate with NH$_4$OH; and then cleaning the silicon substrate by only a wet clean process excluding $NH_4OH$.

15. The method of claim 14, wherein the gate structure is comprised of a gate oxide layer with an overlying polysilicon layer.

16. The method of claim 14, wherein the wet clean process including $NH_4OH$ is conducted at the following parameters:
    $NH_4OH$: from about 10 to 30% by volume;
    $H_2O_2$: from about 10 to 40% by volume;
    $H_2O$: from about 90 to 100% by volume;
    temperature: from about 25 to 80° C.; and
    time: from about 30 to 500 seconds.

17. The method of claim 14, wherein the wet clean process including $NH_4OH$ is conducted at the following parameters:
    $NH_4OH$: from about 15 to 20% by volume;
    $H_2O_2$: from about 20 to 30% by volume;
    $H_2O$: from about 95 to 100% by volume;
    temperature: from about 40 to 75° C.; and
    time: from about 200 to 450 seconds.

18. The method of claim 14, wherein the wet clean process excluding $NH_4OH$ is conducted at the following parameters:
    $H_2O_2$: from about 10 to 40% by volume;
    $H_2O$: from about 90 to 100% by volume;
    temperature: from about 25 to 80° C.; and
    time: from about 30 to 500 seconds.

19. The method of claim 14, wherein the wet clean process excluding $NH_4OH$ is conducted at the following parameters:
    $H_2O_2$: from about 20 to 30% by volume;
    $H_2O$: from about 95 to 100% by volume;
    temperature: from about 40 to 75° C.;
    time: from about 200 to 450 seconds.

20. The method of claim 14, wherein the wet clean process including $NH_4OH$ forms micro-recesses in the silicon substrate.

21. The method of claim 14, wherein the LDD implantation is performed at the following parameters:
    dosage: from about $1 \times 10^{13}$ to $2 \times 10^{15}$ atoms/cm$^2$; and
    energy: from about 0.2 to 70 keV.

22. The method of claim 14, wherein the LDD implantation is performed at the following parameters:
    dosage: from about $1 \times 10^{14}$ to $1 \times 10^{15}$ atoms/cm$^2$; and
    energy: from about 0.2 to 50 keV.

23. The method of claim 14, wherein the LDD implantation uses an element selected from the group consisting of $As^{75}$, $Sb^{221}$, $BF_2$ and $B^{11}$.

24. The method of claim 14, wherein the LDD implantation energy is fine tuned to form NLDD implants.

25. The method of claim 14, wherein the LDD implants are N-type implants and the LDD implantation energy is from about 0.2 to 70 keV.

26. The method of claim 14, wherein the LDD implants are N-type LDD implants and the LDD implantation energy is from about 0.2 to 50 keV.

27. A method of cleaning a silicon substrate before and after an LDD implantation, comprising the sequential steps of:
    providing a silicon substrate having a gate structure formed thereover;
    cleaning the silicon substrate by a wet clean process including $NH_4OH$; the wet clean process including $NH_4OH$ forms micro-recesses in the silicon substrate;
    performing an LDD implantation into the silicon substrate to form LDD implants;
    not contacting the LDD implanted silicon substrate with $NH_4OH$; and
    then cleaning the silicon substrate by only a wet clean process excluding $NH_4OH$.

28. The method of claim 27, wherein the gate structure is comprised of a gate oxide layer with an overlying polysilicon layer.

29. The method of claim 27, wherein the wet clean process including $NH_4OH$ is conducted at the following parameters:
    $NH_4OH$: from about 10 to 30% by volume;
    $H_2O$: from about 10 to 40% by volume;
    $H_2O$: from about 90 to 100% by volume;
    temperature: from about 25 to 80° C.; and
    time: from about 30 to 500 seconds.

30. The method of claim 27, wherein the wet clean process including $NH_4OH$ is conducted at the following parameters:
    $NH_4OH$: from about 15 to 20% by volume;
    $H_2O_2$: from about 20 to 30% by volume;
    $H_2O$: from about 95 to 100% by volume;
    temperature: from about 40 to 75° C.; and
    time: from about 200 to 450 seconds.

31. The method of claim 27, wherein the wet clean process excluding $NH_4OH$ is conducted at the following parameters:
    $H_2O_2$: from about 10 to 40% by volume;
    $H_2O$: from about 90 to 100% by volume;
    temperature: from about 25 to 80° C.; and
    time: from about 30 to 500 seconds.

32. The method of claim 27, wherein the wet clean process excluding $NH_4OH$ is conducted at the following parameters:
    $H_2O_2$: from about 20 to 30% by volume;
    $H_2O$: from about 95 to 100% by volume;
    temperature: from about 40 to 75° C.;
    time: from about 200 to 450 seconds.

33. The method of claim 27, wherein the LDD implantation is performed at the following parameters:
    dosage: from about $1 \times 10^{13}$ to $2 \times 10^{15}$ atoms/cm$^2$; and
    energy: from about 0.2 to 70 keV.

34. The method of claim 27, wherein the LDD implantation is performed at the following parameters:
    dosage: from about $1 \times 10^{14}$ to $1 \times 10^{15}$ atoms/cm$^2$; and
    energy: from about 0.2 to 50 keV.

35. The method of claim 27, wherein the LDD implantation uses an element selected from the group consisting of $As^{75}$, $Sb^{221}$, $BF_2$ and $B^{11}$.

36. The method of claim 27, wherein the LDD implantation energy is fine tuned to form NLDD implants.

37. The method of claim 27, wherein the LDD implants are N-type LDD implants and the LDD implantation energy is from about 0.2 to 70 keV.

38. The method of claim 27, wherein the LDD implants are N-type LDD implants and the LDD implantation energy is from about 0.2 to 50 keV.

39. A method of cleaning a silicon substrate before and after an LDD implantation, comprising the sequential steps of:
    providing a silicon substrate having a gate structure formed thereover;

cleaning the silicon substrate by a wet clean process including $NH_4OH$; the wet clean process including $NH_4OH$ forms micro-recesses in the silicon substrate; the wet clean process including $NH_4OH$ being conducted at the following parameters:
  $NH_4OH$: from about 10 to 30% by volume;
  $H_2O_2$: from about 10 to 40% by volume;
  $H_2O$: from about 90 to 100% by volume;
  temperature: from about 25 to 80° C.; and
  time: from about 30 to 500 seconds
performing an LDD implantation into the silicon substrate to form LDD implants;
not contacting the LDD implanted silicon substrate with $NH_4OH$; and
then cleaning the silicon substrate by only a wet clean process excluding $NH_4OH$.

40. The method of claim 39, wherein the gate structure is comprised of a gate oxide layer with an overlying polysilicon layer.

41. The method of claim 39, wherein the wet clean process including $NH_4OH$ is conducted at the following parameters:
  $NH_4OH$: from about 15 to 20% by volume;
  $H_2O_2$: from about 20 to 30% by volume;
  $H_2O$: from about 95 to 100% by volume;
  temperature: from about 40 to 75° C.; and
  time: from about 200 to 450 seconds.

42. The method of claim 39, wherein the wet clean process excluding $NH_4OH$ is conducted at the following parameters:
  $H_2O_2$: from about 10 to 40% by volume;
  $H_2O$: from about 90 to 100% by volume;
  temperature: from about 25 to 80° C.; and
  time: from about 30 to 500 seconds.

43. The method of claim 39, wherein the wet clean process excluding $NH_4OH$ is conducted at the following parameters:
  $H_2O_2$: from about 20 to 30% by volume;
  $H_2O$: from about 95 to 100% by volume;
  temperature: from about 40 to 75° C.;
  time: from about 200 to 450 seconds.

44. The method of claim 39, wherein the LDD implantation is performed at the following parameters:
  dosage: from about $1\times10^{13}$ to $2\times10^{15}$ atoms/cm$^2$; and
  energy: from about 0.2 to 70 keV.

45. The method of claim 39, wherein the LDD implantation is performed at the following parameters:
  dosage: from about $1\times10^{14}$ to $1\times10^{15}$ atoms/cm$^2$; and
  energy: from about 0.2 to 50 keV.

46. The method of claim 39, wherein the LDD implantation uses an element selected from the group consisting of $As^{75}$, $Sb^{221}$, $BF_2$ and $B^{11}$.

47. The method of claim 39, wherein the LDD implantation energy is fine tuned to form N-type LDD implants.

48. The method of claim 39, wherein the LDD implants are N-type LDD implants and the LDD implantation energy is from about 0.2 to 70 keV.

49. The method of claim 39, wherein the LDD implants are N-type LDD implants and the LDD implantation energy is from about 0.2 to 50 keV.

* * * * *